US011276757B2

United States Patent
Okumura

(10) Patent No.: US 11,276,757 B2
(45) Date of Patent: Mar. 15, 2022

(54) SILICON CARBIDE SEMICONDUCTOR DEVICE AND METHOD OF MANUFACTURING THE SAME

(71) Applicant: Fuji Electric Co., Ltd., Kanagawa (JP)

(72) Inventor: Keiji Okumura, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/182,271

(22) Filed: Nov. 6, 2018

(65) Prior Publication Data
US 2019/0189756 A1    Jun. 20, 2019

(30) Foreign Application Priority Data

Dec. 14, 2017    (JP) .............................. JP2017-239762

(51) Int. Cl.
*H01L 29/16* (2006.01)
*H01L 29/78* (2006.01)
(Continued)

(52) U.S. Cl.
CPC ........ *H01L 29/1608* (2013.01); *H01L 21/046* (2013.01); *H01L 29/0865* (2013.01);
(Continued)

(58) Field of Classification Search
CPC ............. H01L 29/7813; H01L 29/4236; H01L 29/1608; H01L 29/781; H01L 29/1095; H01L 29/7811
See application file for complete search history.

(56) References Cited

U.S. PATENT DOCUMENTS 7,067,879 B1 * 6/2006 Dyer ................... H01L 21/8249
257/341
2011/0062514 A1 * 3/2011 Takano ............... H01L 29/0696
257/334
(Continued)

FOREIGN PATENT DOCUMENTS

| JP | 2012-156370 A | 8/2012 |
|---|---|---|
| JP | 2013-33931 A | 2/2013 |

(Continued)

OTHER PUBLICATIONS

Japanese Office Action dated Oct. 26, 2021 in a counterpart Japanese patent application No. 2017-239762. (A machine translation (not reviewed for accuracy) attached.).

Primary Examiner — Samuel A Gebremariam
Assistant Examiner — Jonas T Beardsley
(74) Attorney, Agent, or Firm — Chen Yoshimura LLP

(57) ABSTRACT

A silicon carbide semiconductor device includes an insulated-gate electrode structure that is formed inside a gate trench that goes through a base region and reaches a upper portion of a current transport layer to control a primary current flowing through the base region; a current suppression layer of the second conductivity type embedded within an upper portion of the current transport layer; a control electrode isolation insulating film filled into a control electrode isolation trench that goes through the base region and reaches an upper portion of the current suppression layer; and a control electrode pad disposed on the control electrode isolation insulating film, wherein an upper portion of the current suppression layer abuts a sidewall of the control electrode isolation insulating film, and a lower portion of the current suppression layer covers at least bottom corners of the control electrode isolation insulating film.

5 Claims, 13 Drawing Sheets

(51) Int. Cl.
*H01L 29/10* (2006.01)
*H01L 21/04* (2006.01)
*H01L 29/08* (2006.01)
*H01L 29/66* (2006.01)
*H01L 29/423* (2006.01)

(52) U.S. Cl.
CPC ...... *H01L 29/0882* (2013.01); *H01L 29/1095* (2013.01); *H01L 29/4236* (2013.01); *H01L 29/66068* (2013.01); *H01L 29/7813* (2013.01); *H01L 29/7815* (2013.01)

(56) References Cited

U.S. PATENT DOCUMENTS

| | | |
|---|---|---|
| 2011/0298446 A1 | 12/2011 | Shiraki et al. |
| 2012/0326207 A1 | 12/2012 | Yoshimochi |
| 2014/0191248 A1 | 7/2014 | Takaya et al. |
| 2015/0171175 A1 | 6/2015 | Takaya et al. |
| 2015/0280611 A1 | 10/2015 | Kusumoto et al. |
| 2016/0260832 A1* | 9/2016 | Oka .................... H01L 29/7397 |
| 2017/0111037 A1 | 4/2017 | Shiigi et al. |
| 2018/0114856 A1* | 4/2018 | Nakano ............... H01L 29/0653 |
| 2019/0341484 A1* | 11/2019 | Takeuchi .............. H01L 21/761 |
| 2020/0243641 A1* | 7/2020 | Nakagawa ........ H01L 29/66704 |

FOREIGN PATENT DOCUMENTS

| | | |
|---|---|---|
| JP | 2014-135367 A | 7/2014 |
| JP | 2015-118966 A | 6/2015 |
| JP | 5979570 B2 | 8/2016 |
| JP | 2017-79324 A | 4/2017 |

* cited by examiner

SILICON CARBIDE SEMICONDUCTOR DEVICE AND METHOD OF MANUFACTURING THE SAME

BACKGROUND OF THE INVENTION

Technical Field

The present invention relates to a silicon carbide (SiC) semiconductor device and a method of manufacturing the same.

Background Art

In power semiconductor devices used to control high voltages and large currents, an active region in which a semiconductor element is formed and a peripheral circuit region in which peripheral circuits such as current sensing circuits, overvoltage protection circuits, temperature sensing circuits, and arithmetic circuits are formed are laid out within a semiconductor substrate. Within the semiconductor substrate, the semiconductor element in the active region is arranged isolated from the peripheral circuits in order to prevent interference. Moreover, a gate pad is formed separated from the active region.

Patent Document 1 discloses an SiC semiconductor device in which the gate pad and the peripheral circuits are isolated from the rest of the device by insulating films formed on the surface of a substrate. Patent Document 2 discloses an SiC semiconductor device in which a p-type isolation region is arranged between the active region and the peripheral circuit region. Patent Document 3 discloses a method of forming an isolation trench at the same time as a gate trench in an Si trench-gate semiconductor device in order to isolate the active region from an edge region of the semiconductor device. Patent Document 4 discloses an Si semiconductor device in which the active region is isolated from a sensing region by a trench.

In insulated-gate semiconductor devices such as MOS field-effect transistors (FETs), a p-type base region for reducing electric field strength is formed beneath the insulating film on which the gate pad is formed. Moreover, a p$^+$ contact region is arranged between the insulating film and the base region in order to prevent the voltage of the base region from floating. As a result, a large-area p-n diode (known as a "parasitic diode" to distinguish this p-n diode from a conventional body diode) exists beneath the gate pad. When a MOSFET is used in a circuit in which current is commuted to the body diode of the MOSFET, this commutation causes a large forward current to flow through the parasitic diode. As a result, the MOSFET generates a large amount of heat, and conduction degradation occurs at locations where the current is concentrated, both of which act to reduce the reliability of the semiconductor device.

RELATED ART DOCUMENTS

Patent Documents

Patent Document 1: Japanese Patent Application Laid-Open Publication No. 2017-79324
Patent Document 2: Japanese Patent No. 5979570
Patent Document 3: Japanese Patent Application Laid-Open Publication No. 2013-33931
Patent Document 4: Japanese Patent Application Laid-Open Publication No. 2012-156370

SUMMARY OF THE INVENTION

In view of the abovementioned problems, the present invention aims to provide an SiC semiconductor device and a method of manufacturing the same which make it possible to reduce concentration of forward current in the parasitic diode and to thereby prevent decreases in reliability.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a silicon carbide semiconductor device, including: a current transport layer made of silicon carbide semiconductor of a first conductivity type; a base region made of silicon carbide semiconductor of a second conductivity type formed on the current transport layer; an insulated-gate electrode structure that is formed inside a gate trench that goes through the base region and reaches the upper portion of the current transport layer to control a primary current flowing through the base region; a current suppression layer of the second conductivity type embedded within an upper portion of the current transport layer at a position different from a position at which the insulating-gate electrode structure is formed in a plan view; a control electrode isolation insulating film filled into a control electrode isolation trench that goes through the base region and reaches an upper portion of the current suppression layer; and a control electrode pad disposed on the control electrode isolation insulating film and electrically connected to the insulated-gate electrode structure, wherein an upper portion of the current suppression layer abuts a sidewall of the control electrode isolation insulating film, and a lower portion of the current suppression layer covers at least bottom corners of the control electrode isolation insulating film in the control electrode isolation trench.

In another aspect, the present disclosure provides a silicon carbide semiconductor device, including: a current transport layer made of silicon carbide semiconductor of a first conductivity type; a base region made of silicon carbide semiconductor of a second conductivity type formed on the current transport layer; an insulated-gate electrode structure of a primary semiconductor device that is formed inside a gate trench that goes through the base region and reaches the upper portion of the current transport layer to control a primary current flowing through the base region; a current suppression layer of the second conductivity type embedded within an upper portion of the current transport layer at a position different from a position at which the insulating-gate electrode structure is formed in a plan view; and an auxiliary device isolation insulating film filled into an auxiliary device isolation trench that goes through the base region and reaches an upper portion of the current suppression layer, wherein an upper portion of the current suppression layer abuts a sidewall of the auxiliary device isolation insulating film, and a lower portion of the current suppression layer covers at least bottom corners of the auxiliary device isolation insulating film in the auxiliary device isolation trench.

In another aspect, the present disclosure provides a method of manufacturing a silicon carbide semiconductor device, including: forming a current transport layer made of silicon carbide semiconductor of a first conductivity type; embedding a current suppression layer of a second conductivity type in an upper portion of the current transport layer; forming a base region made of silicon carbide of the second conductivity type on the current transport layer and the current suppression layer; embedding, in an upper portion of the base region, a main electrode contact region of the first conductivity type and a higher impurity concentration than the current transport layer; simultaneously forming, at different locations in a plan view, a gate trench and a control electrode isolation trench that go through the base region and reach the upper portion of the current transport layer, the control electrode isolation trench being formed over the current suppression layer so as to reach the current suppression layer; filling a control electrode isolation insulating film into the control electrode isolation trench; forming, within the gate trench, an insulated-gate electrode structure that controls a primary current flowing through the base region; and forming, on the control electrode isolation insulating film, a control electrode pad that is electrically connected to the insulated-gate electrode structure.

The present invention makes it possible to provide an SiC semiconductor device and a method of manufacturing the same which make it possible to reduce concentration of forward current in the parasitic diode and to thereby prevent decreases in reliability.

It is to be understood that both the foregoing general description and the following detailed description are exemplary and explanatory, and are intended to provide further explanation of the invention as claimed.

DETAILED DESCRIPTION OF EMBODIMENTS

Figure 1:
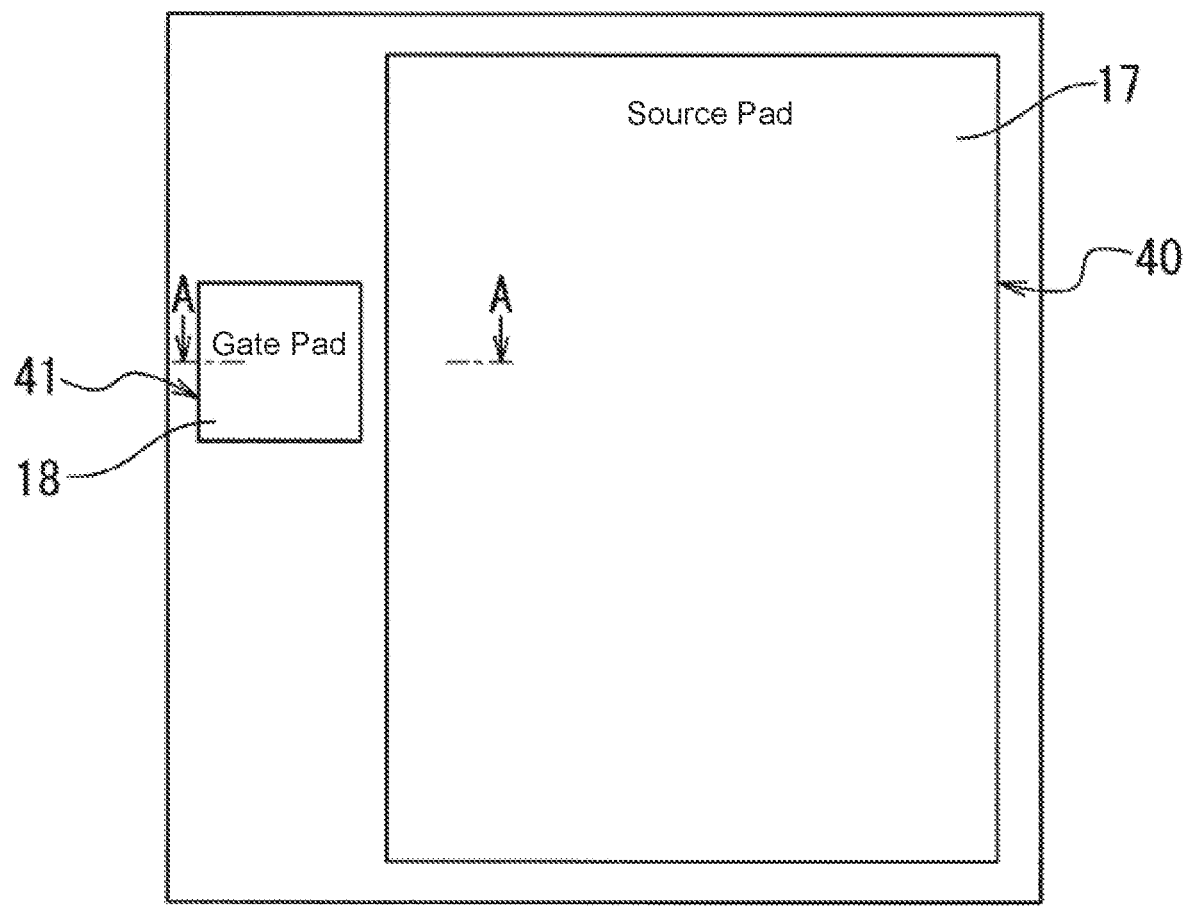
FIG. 1 is a plan view schematically illustrating an example of the layout of a semiconductor device according to Embodiment 1 of the present invention.

Next, Embodiments 1 and 2 of the present invention will be described with reference to figures. In the figures referenced in the descriptions below, the same or similar reference characters are used for components that are the same or similar. However, the figures are only intended to be schematic illustrations, and the relationships between thickness and planar dimensions, the proportions between the thicknesses of each layer, and the like may be different from in the actual devices. Therefore, specific thicknesses and dimensions should be determined by referring to the descriptions below. Similarly, the illustrated dimensional relationships and proportions of components in the figures may differ from one figure to the next.

In the present specification, the term "first main electrode region" refers to one semiconductor region among the source region and the drain region in a field-effect transistor (FET) or a static induction transistor (SIT). In a bipolar transistor (BJT) or an insulated-gate bipolar transistor (IGBT), "first main electrode region" refers to one semiconductor region among the emitter region and the collector region, and in a static induction thyristor (SI thyristor) or a gate turn-off thyristor (GTO), "first main electrode region" refers to one semiconductor region among the anode region and the cathode region. Meanwhile, the term "second main electrode region" refers to the semiconductor region among the source region and the drain region that does not correspond to the first main electrode region for a FET or a SIT, to the region among the emitter region and the collector region that does not correspond to the first main electrode region for a BJT or an IGBT, and to the region among the anode region and the cathode region that does not correspond to the first main electrode region for an SI thyristor or a GTO. In other words, if the first main electrode region is the source region, then the second main electrode region is the drain region. Similarly, if the first main electrode region is the emitter region, then the second main electrode region is the collector region. Likewise, if the first main electrode region is the anode region, then the second main electrode region is the cathode region.

Similarly, in the present specification, the term "control electrode" refers to an electrode that controls a primary current which flows between the first main electrode region and the second main electrode region. For example, in a FET or SIT, this control electrode corresponds to a gate electrode that controls the primary current which flows between the source region and the drain region. Likewise, in an IGBT, this control electrode corresponds to a gate electrode that controls the primary current which flows between the emitter region and the collector region. In an SI thyristor or GTO, this control electrode corresponds to a gate electrode that controls the primary current which flows between the anode region and the cathode region. Moreover, in a BJT, this control electrode corresponds to a base electrode that controls the primary current which flows between the emitter region and the collector region.

Although the following descriptions of the embodiments assume that a "first conductivity type" is n-type and that a "second conductivity type" is p-type as an example, the conductivity types can be selected in the opposite manner such that the first conductivity type is p-type and the second conductivity type is n-type. Moreover, in the present specification and the attached drawings, the symbols + and − are appended to the letters n and p as superscripts to indicate that the corresponding semiconductor region has a higher or lower impurity concentration, respectively, than a semiconductor region for which the symbols + and − are not appended. Furthermore, it should be technically and logically obvious that components or regions designated as being of the first conductivity type or of the second conductivity type in the following descriptions are components or regions which are made of a semiconductor material, even if not explicitly described as such.

In addition, directional terms such as "top" and "bottom" as in "top surface" and "bottom surface" are merely expressions defined for convenience in the context of the illustrated cross-sectional views. For example, when viewing a semiconductor device with the orientation changed by 90°, the "top" and "bottom" directions become the "left" and "right" directions, and when viewing with the orientation changed by 180°, the relationship between the "top" and "bottom" directions is reversed.

As will be described below, one characterizing feature of the present invention is reducing concentration of forward current in a parasitic diode in order to prevent decreases in reliability. In other words, the present invention exhibits a prominent advantageous effect in terms of preventing conduction degradation caused by forward current in the parasitic diode of an insulated-gate transistor such as a MOS transistor. Insulated-gate transistors can be classified more generally as MIS transistors, and MIS transistors include MISFETs and MISSITs. There are also MIS composite SI thyristors, which means that the present invention can be applied to SI thyristors as well. Furthermore, the present invention can also be used to reduce leakage current at interfaces between insulating film layers and semiconductor layers serving as voltage withstand structures near the peripheral portions of power semiconductor devices. Note that as a matter of convenience, the following exemplary descriptions of the embodiments focus on trench-gate MOS transistors (such as that illustrated in FIG. 2) as a representative example. However, upon gaining an understanding the spirit of the present invention as presented below, a person skilled in the art will recognize that the same advantageous effects can be achieved in planar structures such as planar-gate MOS transistors as well.

Embodiment 1

FIG. 1 schematically illustrates an example of a semiconductor device according to Embodiment 1 of the present invention, which includes an active region 40 laid out on an SiC substrate and an extracting electrode region 41 arranged separated from the active region 40. The layout illustrated in FIG. 1 is only an example, and if a structure can reduce electrical influence from the active region 40, a layout of such a structure in which the extracting electrode region 41 is contained within a portion of an equivalent region regarded as being occupied by the active region 40 can be used as an alternative. A semiconductor element is arranged within the active region 40, and a main electrode pad (source pad) 17 is arranged connected to a source region (first main electrode region) of the semiconductor element. In the extracting electrode region 41, a control electrode pad (gate pad) 18 is arranged connected to a gate electrode (control electrode) of the semiconductor element.

Figure 2:
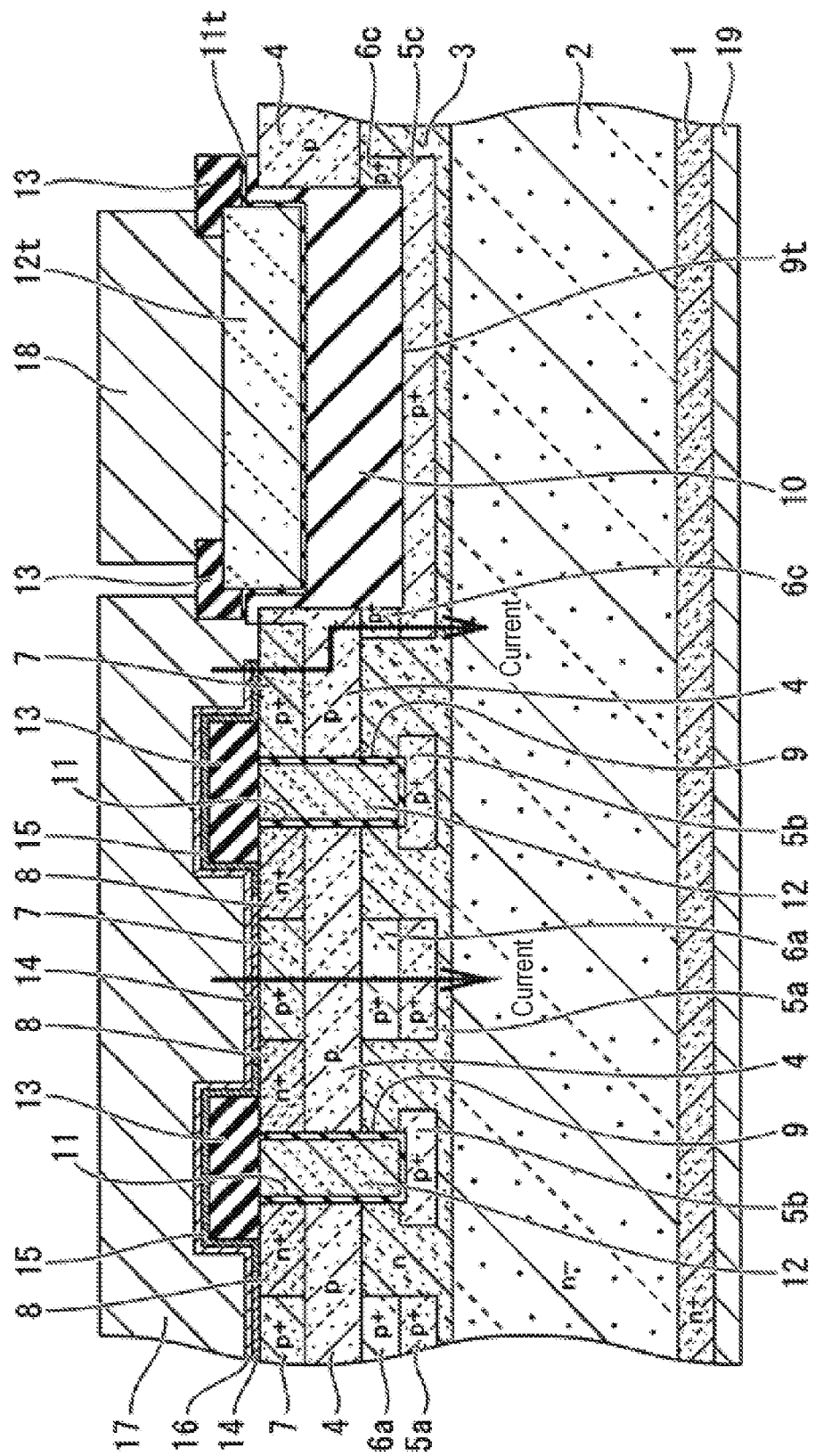
FIG. 2 is a cross-sectional view of the primary components of the semiconductor device taken along a vertical plane through line A-A in FIG. 1.

As illustrated in FIG. 2, the semiconductor element includes an n-type (first conductivity type) current transport layer (2, 3), a p-type base region 4, $p^+$ gate bottom protection regions (embedded regions) 5b, $p^+$ base bottom embedded regions (5a, 6a), and a $p^+$ base contact region 7. The current transport layer (2, 3) is arranged on a top surface side of an $n^+$ drain region (second main electrode region) 1. The current transport layer (2, 3) includes a low-impurity concentration $n^-$ drift layer 2 and an n-type current spreading layer (CSL) 3 which is arranged on a top surface side of the drift layer 2 and has a higher impurity concentration than the drift layer 2. The current spreading layer 3 is formed by introducing n-type impurities into an upper portion of the drift layer 2 and serves to reduce carrier spreading resistance. Note that the current spreading layer 3 may be omitted, in which case the top surface of the drift layer 2 may contact the base region 4 at the position where the top surface of the current spreading layer 3 would otherwise be.

The gate bottom protection regions 5b, the base bottom embedded regions (5a, 6a), and the base contact region 7 all have a higher impurity concentration than the base region. An $n^+$ source region (first main electrode region) 8 of a higher impurity concentration than the drift layer 2 is selectively formed in an upper portion of the base region 4. Moreover, in the upper portion of the base region 4, the $p^+$ base contact region 7 is selectively formed so as to contact the source region 8.

Gate trenches 9 are formed going from the top surface of the source region 8 through the source region 8 and the base region 4 and reaching the current spreading layer 3. A gate insulating film 11 is formed on the bottom surface and side surfaces of each gate trench 9. A gate electrode 12 is embedded within each gate trench 9 with the gate insulating film 11 interposed therebetween, thereby forming insulated-gate electrode structures (11, 12). Note that although in FIG. 2 the gate electrodes 12 are depicted as being embedded only within the gate trenches 9 as an example, each gate electrode 12 may extend through the gate insulating film 11 to the top surface of the source region 8.

The gate bottom protection regions 5b are formed separated from the base region 4 and contacting the bottoms of the gate trenches 9. The gate bottom protection regions 5b protect against high voltages that occur when the gate insulating film 11 positioned near the bottoms of the gate trenches 9 gets reverse-biased. Note that although in FIG. 2 the bottoms of the gate trenches 9 are depicted as going through the upper portion of the current spreading layer 3 and contacting the gate bottom protection regions 5b, this is only an example. The bottoms of the gate trenches 9 may be positioned at the upper portion of the current spreading layer 3 between the base region 4 and the gate bottom protection regions 5b and do not necessarily have to contact the gate bottom protection regions 5b.

Moreover, the base bottom embedded regions (5a, 6a) are respectively arranged on the bottom surface side of the base region 4 beneath the base contact region 7. Each base bottom embedded region (5a, 6a) includes a lower embedded region 5a and an upper embedded region 6a which is arranged on the top surface of the lower embedded region 5a and contacts the bottom surface of the base region 4. The lower embedded region 5a is formed at the same depth as the gate bottom protection regions 5b. The top surface to bottom surface thickness of the lower embedded regions 5a and the gate bottom protection regions 5b is approximately 0.2 μm to 1 μm, for example. The top surface to bottom surface thickness of the upper embedded regions 6a is also approximately 0.2 μm to 1 μm.

In Embodiment 1, the drain region 1 is constituted by a semiconductor substrate made of SiC (an SiC substrate), and the drift layer 2 is constituted by an epitaxial layer made of SiC (an SiC layer). Other semiconductor materials that have a bandgap wider than the 1.1 eV bandgap of Si, such as gallium nitride (GaN), diamond, and aluminum nitride (AlN), can also be used for the drain region 1 and the drift layer 2 as alternatives to SiC. At room temperature, bandgaps of 2.23 eV for 3C—SiC, 3.26 eV for 4H—SiC, 3.02 eV for 6H—SiC, 3.4 eV for GaN, 5.5 eV for diamond, and 6.2 eV for AlN have been reported. Although a wide-bandgap semiconductor with a bandgap of at least 2.0 eV can be used for the drain region 1 and the drift layer 2 and the like, in the field of LEDs and similar, the term "wide-bandgap" is typically defined to mean a bandgap of at least 2.5 eV. The present invention will be described with the 3.26 eV bandgap of 4H—SiC at room temperature being the standard for the bandgap of a wide-bandgap semiconductor.

In the gate trenches 9 going through the source region 8 and the base region 4 in the depth direction, the bottoms of these gate trenches 9 reach the current spreading layer 3. Although FIG. 2 depicts an example in which the bottom surfaces of the gate trenches 9 are flat surfaces, the bottoms of the gate trenches 9 may alternatively be curved surfaces. In terms of planar patterns, the gate trenches 9 defining the unit cell structures of the semiconductor element may be arrayed in a stripe-shaped pattern or may have a rectangular planar pattern or a polygonal (such as hexagonal) planar pattern. The depth, width, and pitch of the gate trenches 9 are respectively approximately 1 μm to 2 μm, approximately 0.5 μm to 1 μm, and approximately 1 μm to 2 μm, for example.

Examples of materials that can be used for the gate insulating film 11 include single-layer films or multilayer composite films or the like made of any one or more of the following: silicon oxide films ($SiO_2$ films) such as high temperature silicon oxide (HTO); silicon oxynitride (SiON) films; and strontium oxide (SrO) films, silicon nitride ($Si_3N_4$) films, aluminum oxide ($Al_2O_3$) films, magnesium oxide (MgO) films, yttrium oxide ($Y_2O_3$) films, hafnium oxide ($HfO_2$) films, zirconium oxide ($ZrO_2$) films, tantalum oxide ($Ta_2O_5$) films, and bismuth oxide ($Bi_2O_3$) films having a greater relative permittivity than $SiO_2$ films. The thickness of the gate insulating film 11 is approximately 10 nm to 150 nm.

A polysilicon layer doped with a high concentration of impurities such as phosphorus (P) (a doped polysilicon layer), for example, can be used as the material for the gate electrodes 12. The main electrode pad (source pad) 17 arranged above the gate electrodes 12 with an interlayer insulating film 13 interposed therebetween is arranged so as to be isolated from the control electrode pad (gate pad) 18 arranged in the extracting electrode region 41. The main electrode pad 17 is electrically connected to the source region 8 and the base contact region 7 via a source electrode (14, 15, 16). The control electrode pad 18 is electrically connected to the gate electrodes 12.

The source electrode (14, 15, 16) arranged on the bottom surface of the main electrode pad 17 includes a source contact layer 14 serving as a base metal as well as a lower barrier metal layer 15 and an upper barrier metal layer 16. The source contact layer 14 is arranged in metallurgical contact with the source region 8 and the base contact region 7. The lower barrier metal layer 15 is arranged metallurgically contacting the source region 8 and covering the interlayer insulating film 13. The upper barrier metal layer 16 is arranged covering the source contact layer 14 and the lower barrier metal layer 15, and the main electrode pad 17 is arranged covering the upper barrier metal layer 16. A nickel (Ni) film can be used for the source contact layer 14, a titanium nitride (TiN) film can be used for the lower barrier metal layer 15, and a multilayer titanium (Ti)/TiN/Ti structure can be used for the upper barrier metal layer 16, for example. Moreover, aluminum (Al) or an Al alloy such as Al—Si, Al-copper (Cu), or Al—Cu—Si can be used for the main electrode pad 17. The same material used for the main electrode pad 17 can also be used for the control electrode pad 18.

On the bottom surface side of the drain region 1, a rear surface electrode (drain electrode) 19 is arranged contacting the drain region 1. A single-layer film made of gold (Au) or a multilayer metal film made by layering Al, nickel (Ni), and Au in that order can be used for the drain electrode 19, for example, and a metal plate made of molybdenum (Mo) or tungsten (W) or the like may be further layered beneath the lowermost layer of the drain electrode 19.

As illustrated in FIG. 2, the n-type current transport layer (2, 3), a p-type current suppression layer (5c, 6c), and the p-type base region 4 are arranged in the extracting electrode region 41 as lower semiconductor regions. The current transport layer (2, 3) includes then drift layer 2 and the n-type current spreading layer 3. The current suppression layer (5c, 6c) includes a $p^+$ lower embedded region 5c and a $p^+$ upper embedded region 6c. The lower embedded region 5c is formed within the current spreading layer 3. The upper embedded region 6c is arranged on the top surface of the lower embedded region 5c and contacts the bottom surface of the base region 4. The base region 4 is arranged on the top surface of the current suppression layer (5c, 6c).

A control electrode isolation insulating film 10 is filled into a control electrode isolation trench 9t formed going through the base region 4 and the upper embedded region 6c and reaching the lower embedded region 5c. An extracting region insulating film 11t and an extracting electrode 12t which is electrically connected to the gate electrodes 12 are formed on the control electrode isolation insulating film 10. The control electrode pad 18 is formed on the extracting electrode 12t. The interlayer insulating film 13 is formed on the edges of the extracting electrode 12t. The side faces and bottom surface of the control electrode isolation insulating film 10 are surrounded by the base region 4 and the current suppression layer (5c, 6c). Thus, in Embodiment 1, the control electrode isolation insulating film 10 is arranged below the control electrode pad 18. The p-type base region 4 and the upper embedded region 6c extending from the active region 40 into the extracting electrode region 41 are terminated by the side faces of the control electrode isolation insulating film 10 and therefore have a small cross-sectional area as taken perpendicular to the direction going from the front surface side to the rear surface side. The cross-sectional area of the upper embedded region 6c contacting the edge of the control electrode isolation insulating film 10 is limited to being particularly small.

An $SiO_2$ film, an $Si_3N_4$ film, or an SiON film or the like or a composite film or the like made by layering a plurality of such films together can be used for the control electrode isolation insulating film 10. Moreover, a single-layer film or multilayer composite film or the like made of any one or more of an SrO film, an $Al_2O_3$ film, an MgO film, a $Y_2O_3$ film, an $HfO_2$ film, a $ZrO_2$ film, a $Ta_2O_5$ film, or a $Bi_2O_3$ film having a greater relative permittivity than an $SiO_2$ film can be used. However, in order to reduce electrical coupling, it is preferable that a low dielectric constant (low-k) insulating film such as a porous silica film, a fluorine-containing $SiO_2$ (SiOF) film, a spin-on glass (SOG) film, or a carbon-containing $SiO_2$ (SiOC) film be used for the control electrode isolation insulating film 10. Furthermore, a cavity may be included in the control electrode isolation insulating film 10. It is preferable that the thickness of the control electrode isolation insulating film 10 be greater than that of the gate insulating film 11 and approximately equal to the depth of the gate trenches 9; in other words, a thickness of approximately 100 nm to 2 µm is preferable.

In the MOSFET according to Embodiment 1 and having the example structure illustrated in FIG. 2, the base contact region 7, the base region 4, the upper embedded region 6a, the lower embedded region 5a, and the current transport layer (2, 3) in the center form a p-n diode (body diode). Moreover, the base contact region 7, the base region 4, the upper embedded region 6c, the lower embedded region 5c, and the current transport layer (2, 3) on the right side near the control electrode pad 18 form a p-n diode (parasitic diode). In FIG. 2, the arrows represent current paths going through the body diode and the parasitic diode. The current path going through the parasitic diode is substantially restricted by the minimized cross-sectional area of the upper embedded region 6c. Thus, because Embodiment 1 makes it possible to reduce the cross-sectional area of the base region 4 and the upper embedded region 6c, the effective cross-sectional area of the parasitic diode can be made to be less than or equal to the cross-sectional area of the base contact region 7 to the lower embedded region 5a.

Figure 3:
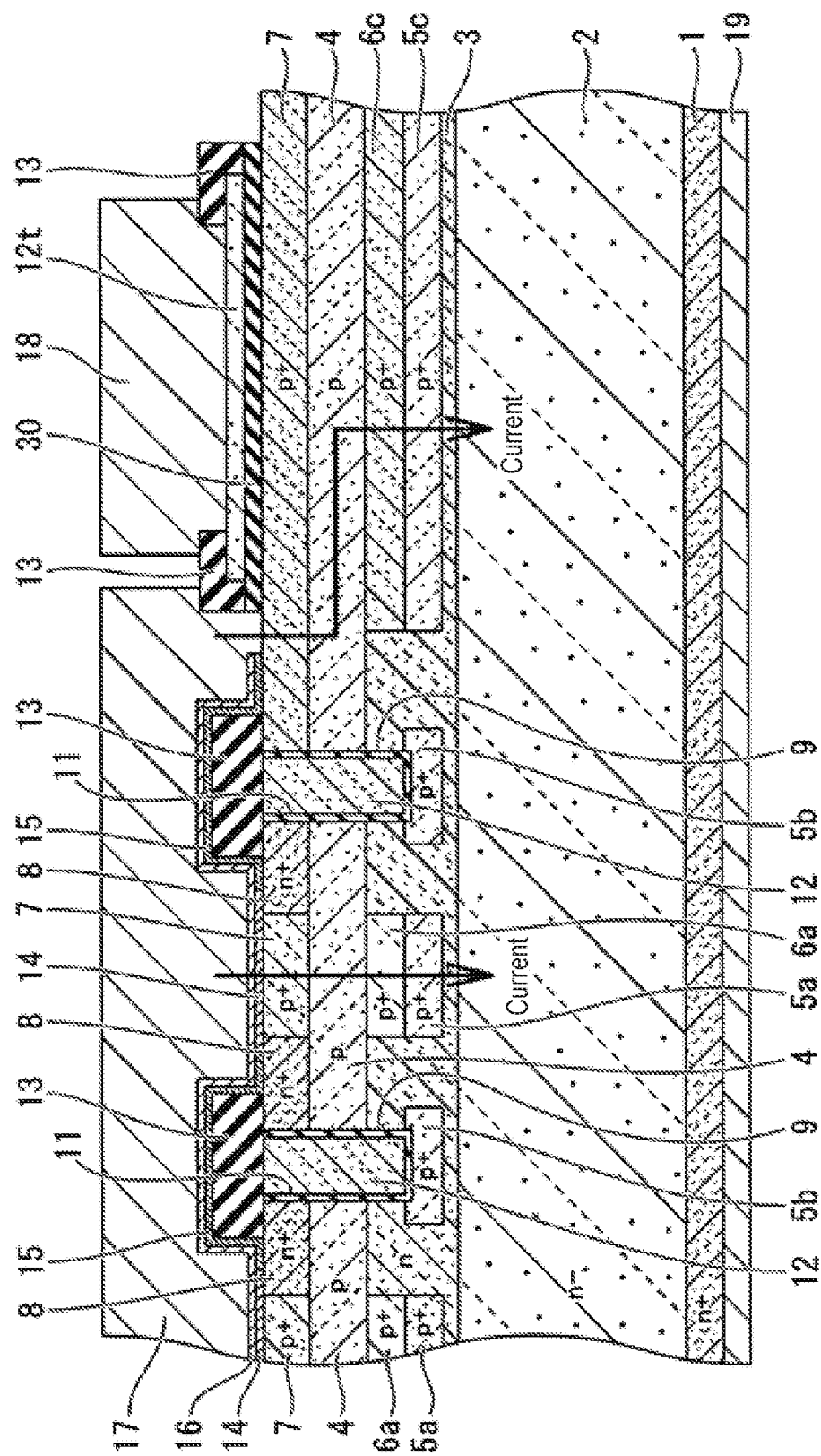
FIG. 3 is a cross-sectional view of the primary components of a semiconductor device according to a comparison example.

FIG. 3 illustrates current paths going through a body diode and a parasitic diode in a conventional MOSFET. As illustrated in FIG. 3, a control electrode pad 18 and an extracting electrode 12t are formed on a control electrode isolation insulating film 30 arranged on a base contact region 7. Here, the cross-sectional area of the base contact region 7, a base region 4, an upper embedded region 6c, and a lower embedded region 5c is substantially equal to the cross-sectional area of the control electrode pad 18 or the extracting electrode 12t. Moreover, the cross-sectional area of the parasitic diode formed by the base contact region 7 to the lower embedded region 5c is greater than the cross-sectional area of the body diode formed by the base contact region 7 to a lower embedded region 5a. As a result, during commutation, a large forward current flows through the parasitic diode, thereby causing the MOSFET to generate a large amount of heat and also causing conduction degradation to occur.

As described above, the MOSFET according to Embodiment 1 makes it possible to substantially reduce the cross-sectional area of the current path going through the parasitic diode formed near the peripheral portion of the main electrode pad 17, thereby making it possible to prevent conduction degradation dependent on this current path going through the parasitic diode. Furthermore, the depth of the control electrode isolation trench 9t is approximately 1 µm to 2 µm. The thickness of the control electrode isolation insulating film 10 filled into the control electrode isolation trench 9t can be approximately the same as the depth of the control electrode isolation trench 9t itself. The thickness of the gate insulating film 11 is approximately 10 nm to 150 nm. The thicknesses of the control electrode isolation insulating film 10 and the extracting region insulating film 11t arranged below the control electrode pad 18 can be set to be greater than the thickness of the gate oxide film 11. This makes it possible to reduce the strength of the electric field applied to the control electrode isolation insulating film 10 below the control electrode pad 18. In addition, although the electric field would typically tend to be particularly concentrated near the corners of the bottom surface of the control electrode isolation insulating film 10, here this bottom surface is covered by the lower embedded region 5c, which makes it possible to prevent concentration of the electric field.

Next, a method of manufacturing an insulated-gate semiconductor device according to Embodiment 1 of the present invention will be described with reference to FIGS. 4 to 11, using a case of manufacturing a trench-gate MOSFET as an example. Note that the method of manufacturing a trench-gate MOSFET described below is only an example, and various modifications thereof or other methods of manufacturing can be implemented within the scope and spirit of the claims.

Figure 4:
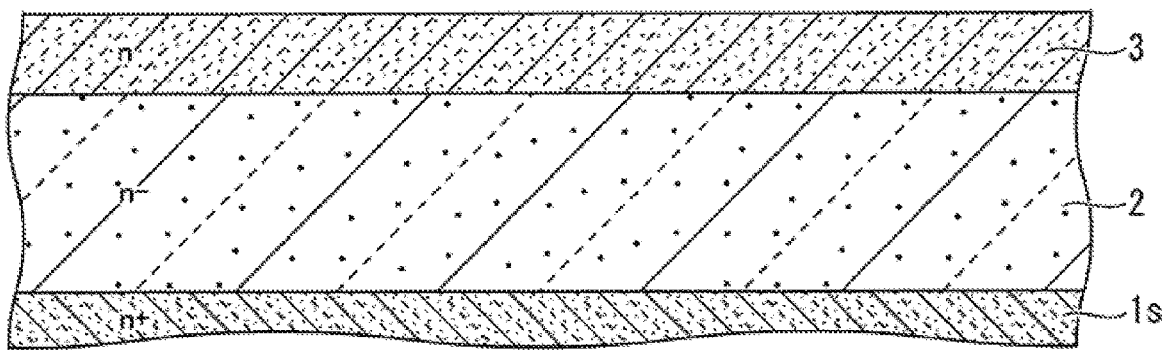
FIG. 4 is a cross-sectional view for explaining a step in an example of a method of manufacturing the semiconductor device according to Embodiment 1 of the present invention.

First, an $n^+$ semiconductor substrate (SiC substrate) doped with n-type impurities such as nitrogen (N) is prepared. Next, as illustrated in FIG. 4, using this $n^+$ SiC substrate as the drain region 1, the $n^-$ drift layer 2 is epitaxially grown. Then, a multi-stage ion implantation process is performed to introduce n-type impurity ions such as nitrogen (N) into the top surface of the drift layer 2. Next, a heat treatment is applied to activate the implanted n-type impurity ions, thereby forming the n-type current spreading layer 3 as illustrated in FIG. 4. Note that here, the current spreading layer 3 may alternatively be epitaxially grown on the top surface of the drift layer 2.

Figure 5:
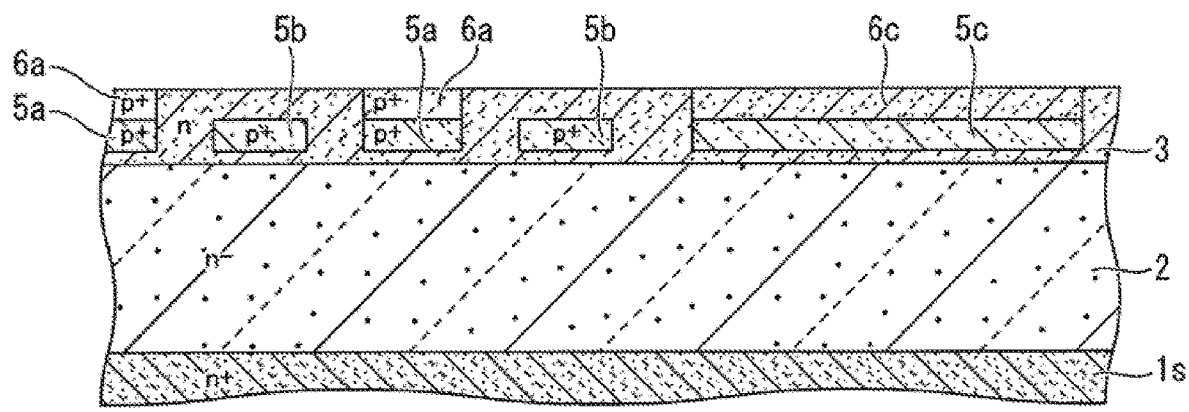
FIG. 5 is a cross-sectional view for explaining the step after FIG. 4 in the example of the method of manufacturing the semiconductor device according to Embodiment 1 of the present invention.

Next, using a photolithography technology and an ion implantation technology or the like, p-type impurities such as Al are selectively implanted. Then, as illustrated in FIG. 5, a heat treatment is applied to activate the implanted p-type impurity ions, thereby selectively forming the $p^+$ lower embedded regions 5a, 5b, and 5c within the current spreading layer 3. Next, using a photolithography technology and an ion implantation technology or the like, p-type impurities such as Al are selectively ion-implanted. Then, a heat treatment is applied to activate the implanted p-type impurity ions, thereby selectively embedding the upper embedded regions 6a and 6c in the upper portion of the current spreading layer 3 as illustrated in FIG. 5. The upper embedded regions 6a contact the upper surfaces of the lower embedded regions 5a, and the upper embedded region 6c contacts the upper surface of the lower embedded region 5c.

Figure 6:
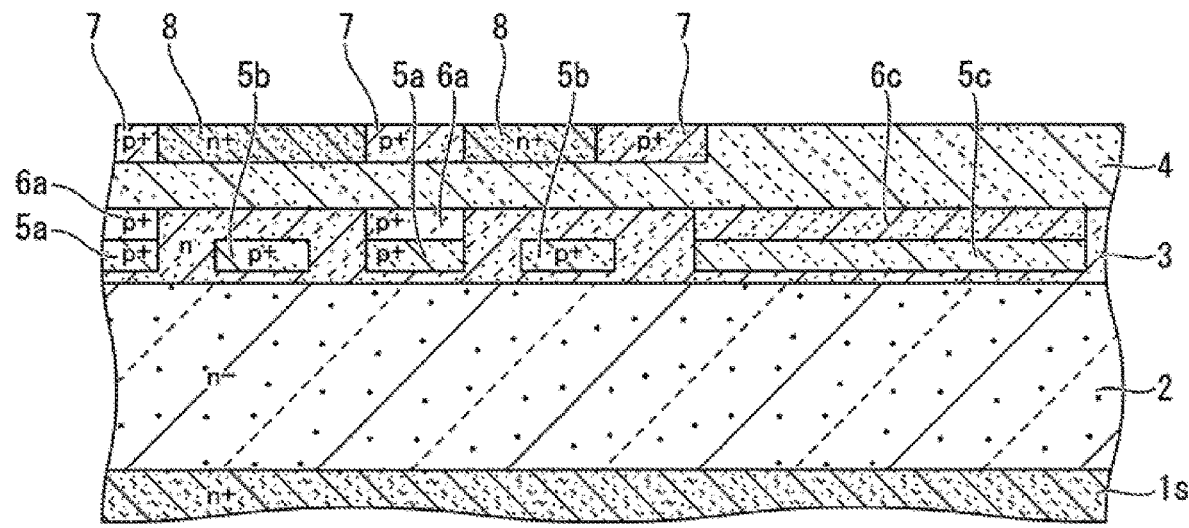
FIG. 6 is a cross-sectional view for explaining the step after FIG. 5 in the example of the method of manufacturing the semiconductor device according to Embodiment 1 of the present invention.

Next, the p-type base region 4 is epitaxially grown on the top surface of the current spreading layer 3. Then, using a photolithography technology and an ion implantation technology or the like, n-type impurity ions such as N are selectively implanted in the upper surface of the base region 4. Next, using a photolithography technology and an ion implantation technology or the like, p-type impurity ions such as Al are selectively implanted in the base region 4. Then, a heat treatment is applied to activate the implanted n-type impurity ions and p-type impurity ions. Thus, as illustrated in FIG. 6, the $n^+$ source region 8 and the $p^+$ base contact region 7 are selectively embedded in the upper surface of the base region 4.

Note that although in the example described above a heat treatment is applied after each of the ion implantation processes for forming the lower embedded regions 5a, 5b, and 5c; the upper embedded regions 6a and 6c; the source region 8; and the base contact region 7, a heat treatment does not necessarily need to be applied after each ion implantation process. For example, a single heat treatment may be applied after performing all of the ion implantation processes for forming the lower embedded regions 5a, 5b, and 5c; the upper embedded regions 6a and 6c; the source region 8; and the base contact region 7 in order to activate all of the ion-implanted regions at once.

Figure 7:
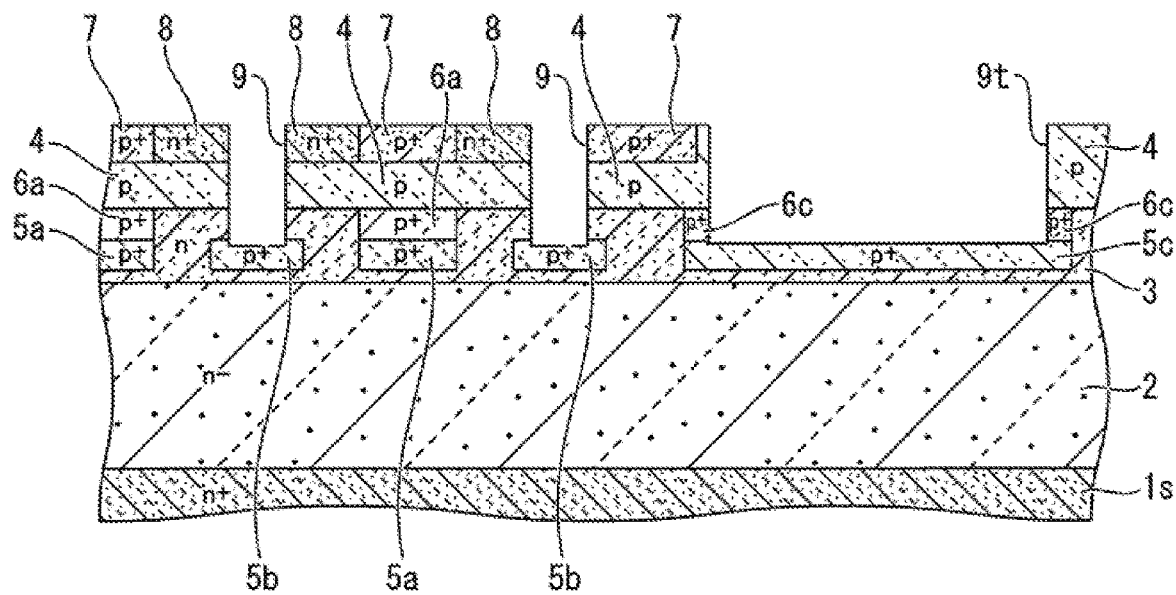
FIG. 7 is a cross-sectional view for explaining the step after FIG. 6 in the example of the method of manufacturing the semiconductor device according to Embodiment 1 of the present invention.

Next, using a photolithography technology and a dry etching process such as reactive ion etching (RIE), or the like, the gate trenches 9 and the control electrode isolation trench 9t are selectively formed. As illustrated in FIG. 7, the gate trenches 9 go through the source region 8 and the base region 4 and reach the embedded layers 5b in the current spreading layer 3. The control electrode isolation trench 9t goes through the base region 4 and the upper embedded region 6c and reaches the lower embedded region 5c. As a result, the side surfaces of the control electrode isolation trench 9t are covered by the base region 4 and the upper embedded region 6c, and the bottom surface and bottom surface corners are covered by the lower embedded region 5c. Moreover, the upper embedded region 6c is formed in a ring shape, with the edges of the upper embedded region 6c surrounding the periphery of the control electrode isolation trench 9t.

Figure 8:
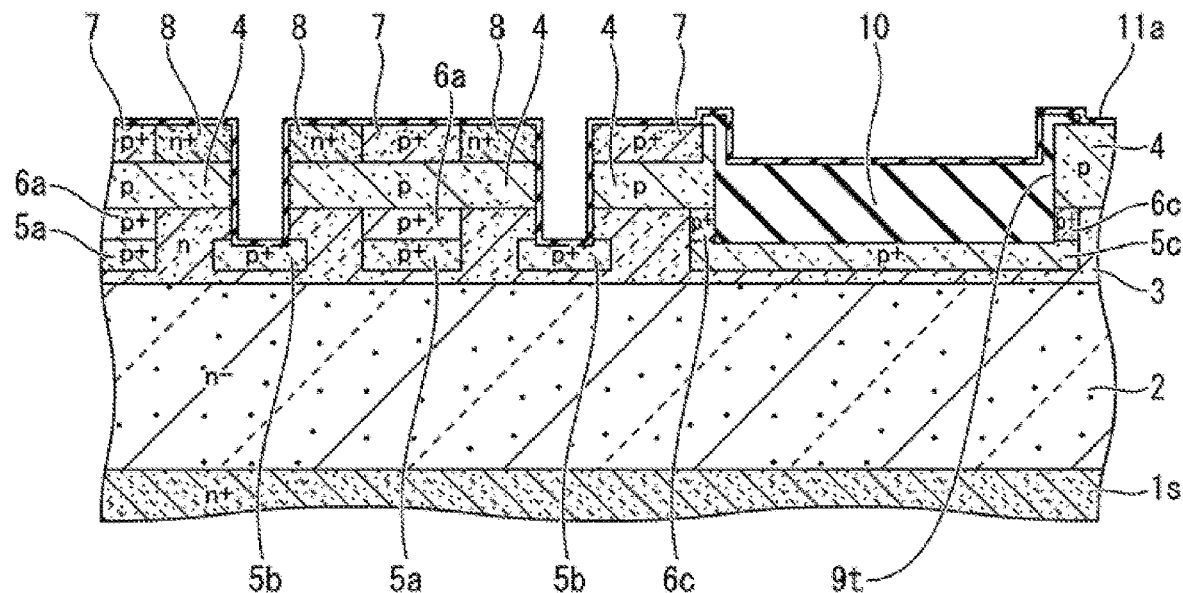
FIG. 8 is a cross-sectional view for explaining the step after FIG. 7 in the example of the method of manufacturing the semiconductor device according to Embodiment 1 of the present invention.

Next, using a chemical vapor deposition (CVD) process or the like, an insulating film is deposited filling in the control electrode isolation trench 9t. Then, using an etch-back process utilizing a dry etching technology or the like, for example, the control electrode isolation insulating film 10 is formed within the control electrode isolation trench 9t. Next, as illustrated in FIG. 8, using a low-pressure CVD process or the like, an insulating film 11a such as an HTO film is deposited on the bottom surfaces and side surfaces of the gate trenches 9 as well as on the top surfaces of the source region 8, the base contact region 7, the base region 4, and the control electrode isolation insulating film 10.

Figure 9:
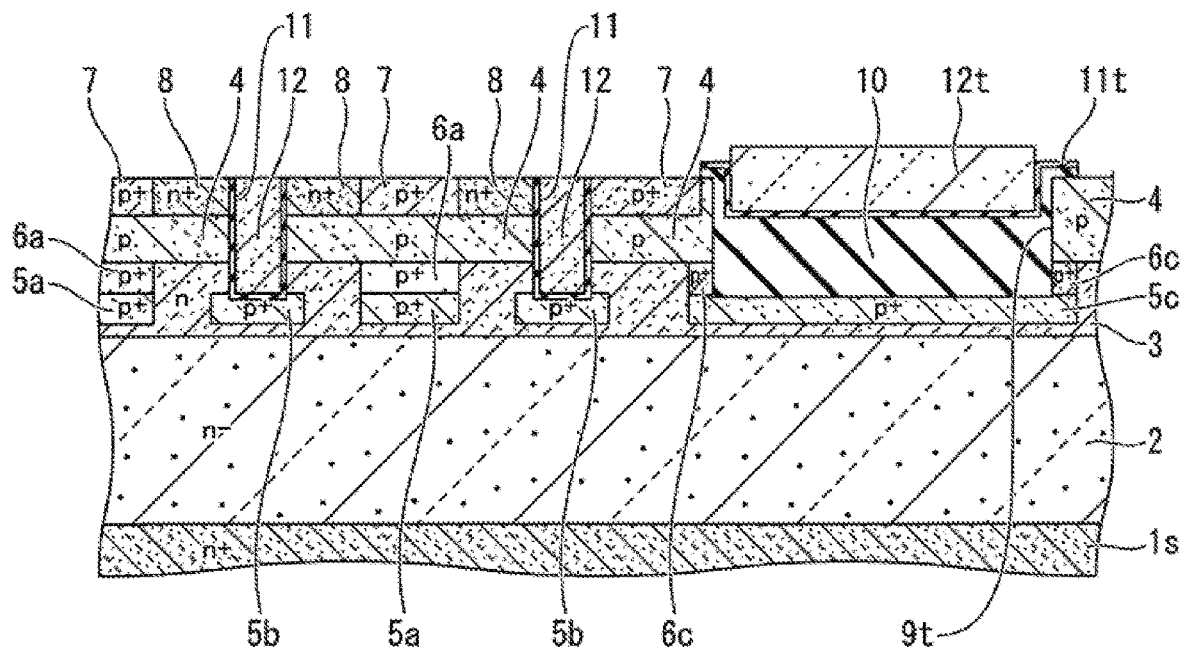
FIG. 9 is a cross-sectional view for explaining the step after FIG. 8 in the example of the method of manufacturing the semiconductor device according to Embodiment 1 of the present invention.

Then, using a CVD process or the like, a polysilicon layer doped with a high concentration of impurities such as phosphorus (P) (a doped polysilicon layer) is deposited filling in the gate trenches 9. Next, using a photolithography technology and a dry etching process or the like, portions of the polysilicon layer and the insulating film 11a are selectively removed. As a result, as illustrated in FIG. 9, gate electrode structures constituted by the gate insulating film 11 deposited on the side surfaces and bottom surfaces of the gate trenches 9 as well as the gate electrodes 12 made of the polysilicon layer are formed. Moreover, the extracting region insulating film 11t (which becomes part of the control electrode isolation insulating film 10) is formed on the top surface of the control electrode isolation insulating film 10, and the extracting electrode 12t made of the polysilicon layer is formed on the top surface of the extracting region insulating film 11t.

Figure 10:
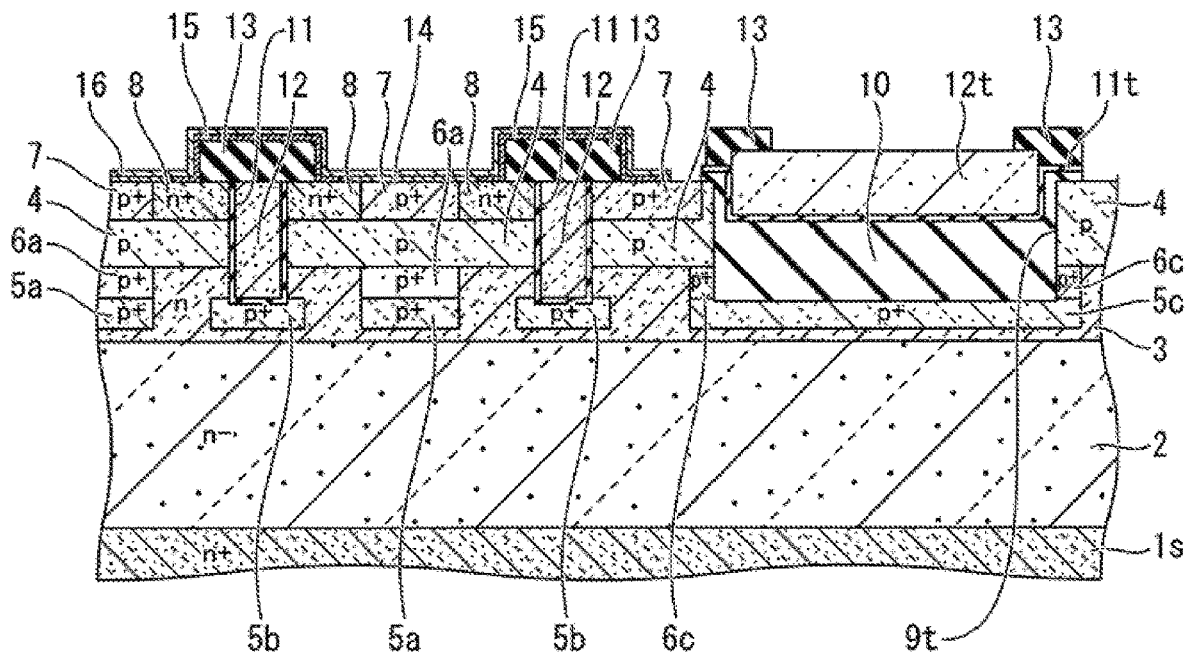
FIG. 10 is a cross-sectional view for explaining the step after FIG. 9 in the example of the method of manufacturing the semiconductor device according to Embodiment 1 of the present invention.

Next, using a CVD process or the like, an insulating film is deposited on the top surfaces of the gate electrode structures constituted by the gate electrodes 12 and the gate insulating film 11 as well as on the top surface of the extracting electrode 12t. Then, using a photolithography technology and a dry etching process, the deposited insulating film is selectively removed. As a result, source contact holes and a gate contact hole are formed in the interlayer insulating film 13. Next, using a sputtering process or a vapor deposition process or the like, a metal layer such as an Ni film is deposited, and, using a photolithography technology and RIE or the like, this metal layer is patterned. Then, a heat treatment such as rapid thermal annealing (RTA) is performed at 1000° C., for example, to form the source contact layer 14. Next, using a sputtering process or the like, layers such as a TiN film and a (Ti)/TiN/Ti multilayer film and the like are deposited, and, using a photolithography technology and RIE or the like, these metal layers are patterned to form the lower barrier metal layer 15 and the upper barrier metal layer 16. As a result, as illustrated in FIG. 10, the source contact layer 14 is formed on the top surfaces of the base contact region 7 and the source region 8. Moreover, the lower barrier metal layer 15 is formed covering the interlayer insulating film 13, and the upper barrier metal 16 is formed covering the source contact layer 14 and the lower barrier metal 15.

Figure 11:
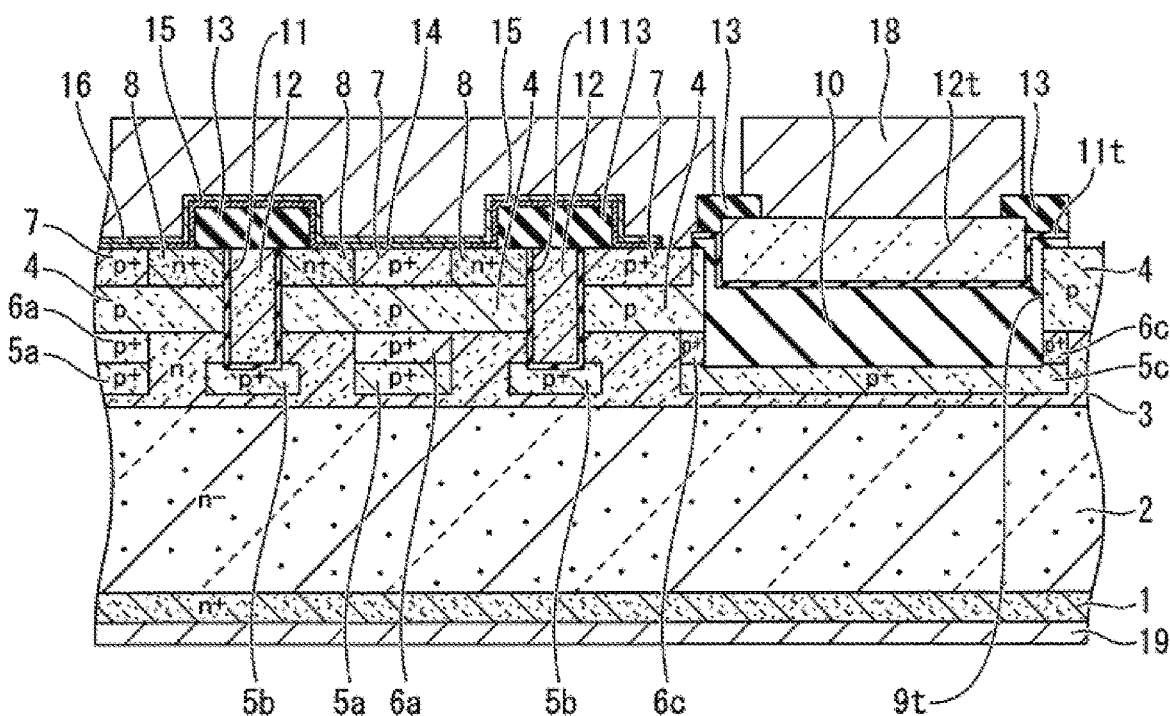
FIG. 11 is a cross-sectional view for explaining the step after FIG. 10 in the example of the method of manufacturing the semiconductor device according to Embodiment 1 of the present invention.

Next, using a sputtering process or the like, a metal layer such as an Al film is deposited. Then, using a photolithography technology and RIE or the like, this metal layer is patterned to form the source pad 17 and the gate pad (control electrode pad) 18. Next, using a sputtering process or a vapor deposition process or the like, the drain electrode 19 made of Au or the like is formed over the entire bottom surface of the drain region 1. This, as illustrated in FIG. 11, completes the insulated-gate semiconductor device according to Embodiment 1.

In the method of manufacturing the insulated-gate semiconductor device according to Embodiment 1 of the present invention, the thick control electrode isolation insulating film 10 is embedded on and within the current suppression layer (5c, 6c) below the gate pad (control electrode pad) 18. This reduces the cross-sectional area of the parasitic diode, thereby preventing conduction degradation, and also makes it possible to provide an insulated-gate semiconductor device that makes it possible to reduce the strength of the electric field near the bottom surface of the control electrode isolation insulating film 10.

Modification Example of Embodiment 1

Figure 12:
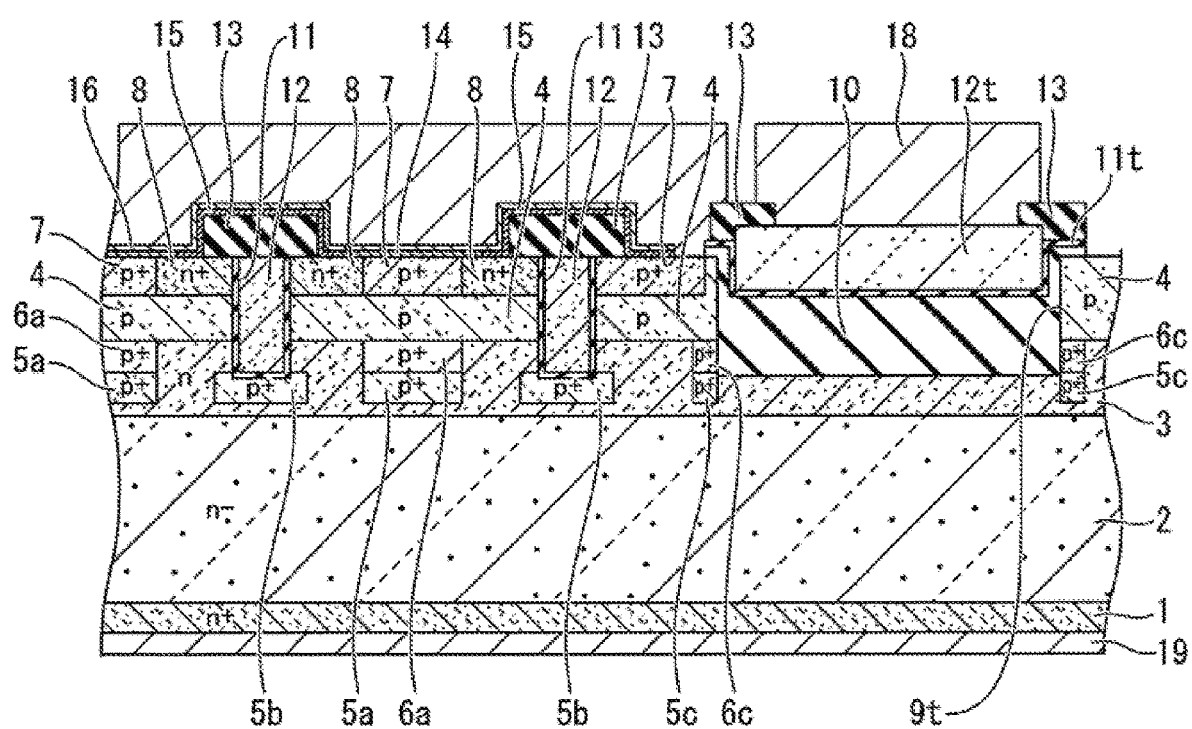
FIG. 12 is a cross-sectional view illustrating the primary components of an example of a semiconductor device according to a modification example of Embodiment 1 of the present invention.

As illustrated in FIG. 12, in a semiconductor device according to a modification example of Embodiment 1, the corners of the bottom surface of the control electrode isolation insulating film 10 are covered by a first lower embedded region 5c, while a center portion of the bottom surface of the control electrode isolation insulating film 10 below the control electrode pad 18 contacts the current spreading layer 3. This modification example of Embodiment 1 is different from Embodiment 1 only in that this center portion of the bottom surface of the control electrode isolation insulating film 10 contacts the current spreading layer 3. The rest of the configuration is the same as in Embodiment 1 and therefore will not be described again here.

As illustrated in FIG. 12, in this modification example of Embodiment 1, only the corners of the bottom surface of the control electrode isolation insulating film 10 are covered by the first lower embedded region 5c. Therefore, the current path going through the parasitic diode is substantially restricted by the cross-sectional area of a second upper embedded region 6c and the first lower embedded region 5c. In this modification example of Embodiment 1, the portion of the current path having a small cross-sectional area due to being constituted by the second upper embedded region 6c and the first lower embedded region 5c is formed to be longer than in Embodiment 1. This makes it possible to further substantially reduce the cross-sectional area of the current path going through the parasitic diode, thereby making it possible to prevent conduction degradation.

Embodiment 2

Figure 13:
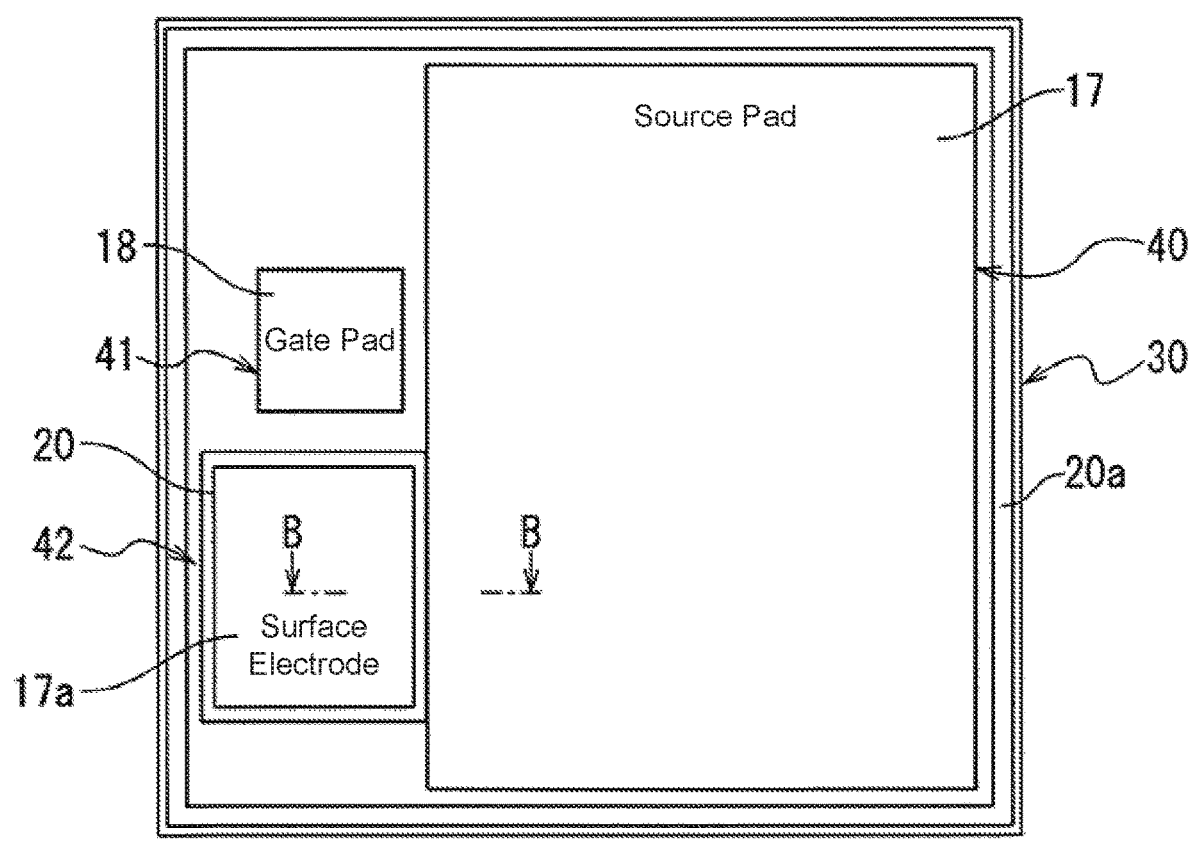
FIG. 13 is a plan view schematically illustrating an example of the layout of a semiconductor device according to Embodiment 2 of the present invention.

As illustrated in FIG. 13, an insulated-gate semiconductor device according to Embodiment 2 of the present invention includes an active region 40, an extracting electrode region 41, and a peripheral circuit region 42. The peripheral circuit region 42 is formed separated from the active region 40 and the extracting electrode region 41 and is surrounded by an isolation region 20 to provide isolation from the active region 40 and the extracting electrode region 41. An auxiliary device is arranged within the peripheral circuit region 42, and a surface electrode (third surface electrode) 17a which is connected to the auxiliary device is formed on the top surface thereof. The layout illustrated in FIG. 13 is only an example, and as long as electrical influence from the active region 40 can be reduced, a layout in which the active region 40 has a polygonal shape including recesses and the extracting electrode region 41 and the peripheral circuit region 42 are contained within those recesses can be used as an alternative. Embodiment 2 of the present invention is different from Embodiment 1 only in terms of the inclusion of the peripheral circuit region 42 containing the auxiliary device. The rest of the configuration is the same as in Embodiment 1 and therefore will not be described again here.

A peripheral circuit is arranged within the peripheral circuit region 42. Examples of peripheral circuits that can be used include overvoltage protection circuits for protecting the semiconductor element from overvoltage, current sensing circuits for detecting current flowing through the semiconductor element, temperature sensing circuits for detecting the temperature of the semiconductor element, and arithmetic circuits for controlling the semiconductor element. In Embodiment 2 of the present invention, a case in which a current sensing circuit is used as the peripheral circuit will be described.

Figure 14:
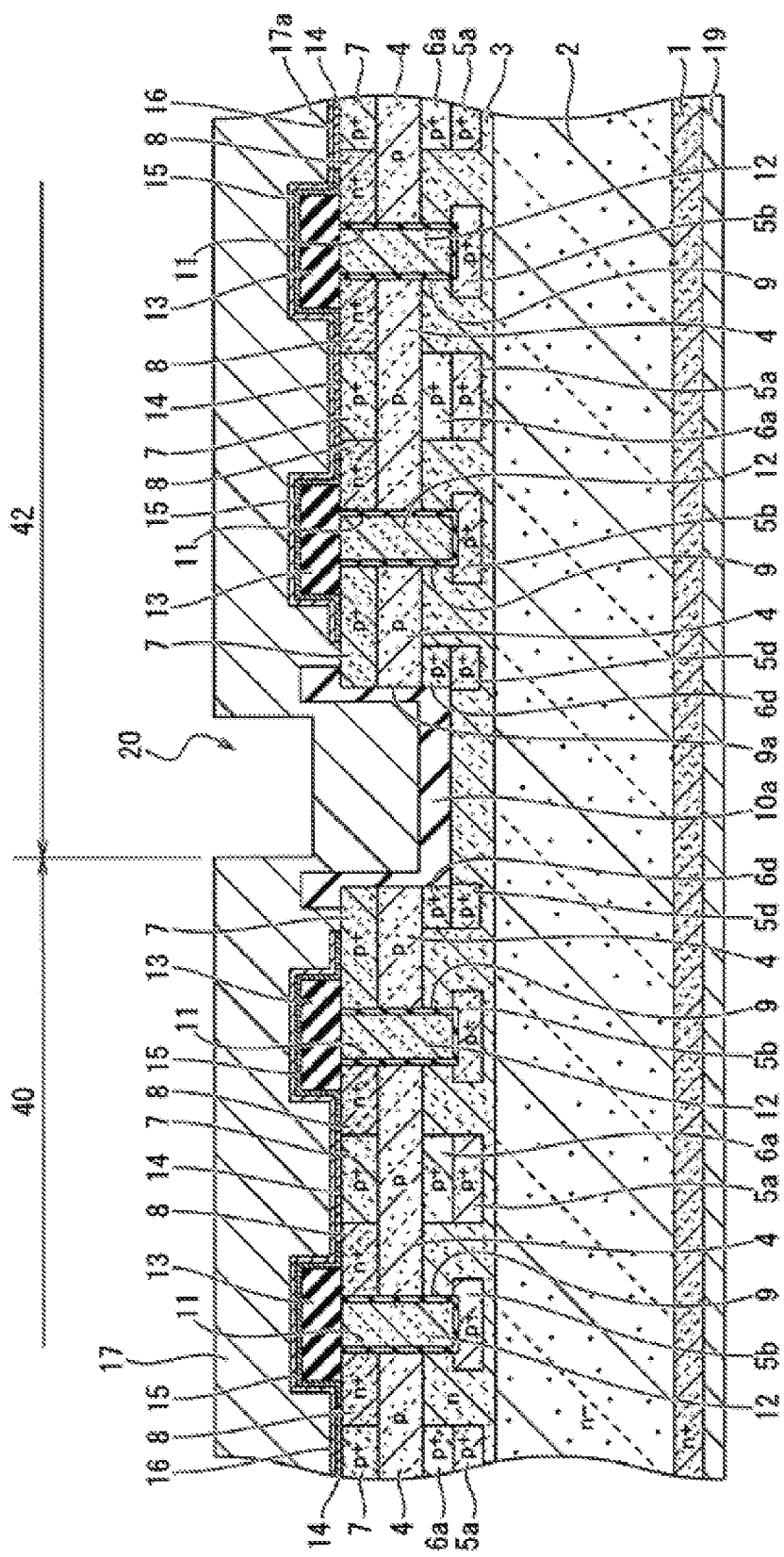
FIG. 14 is a cross-sectional view of the primary components of the semiconductor device taken along a vertical plane through line B-B in FIG. 13.

As illustrated in FIG. 14, in the semiconductor device according to Embodiment 2 of the present invention, a case in which the auxiliary device formed in the peripheral circuit region 42 is substantially the same as the semiconductor element formed in the active region 40 will be described as an example. In an isolation trench region 20, an auxiliary device isolation insulating film 10a is filled into an auxiliary device isolation trench 9a going through the base contact region 7, the base region 4, and an upper embedded region 6d and reaching the current spreading layer 3. The bottom surface of the auxiliary device isolation insulating film 10a contacts the current spreading layer 3, and the corners of this bottom surface are covered by a lower embedded region 5d. Thus, the side faces and bottom surface corners of the auxiliary device isolation insulating film 10a are completely surrounded by the p-type base contact region 7, the base region 4, and a current suppression layer (5d, 6d). Here, the auxiliary device is a current sensing circuit, so the source pad (third surface electrode) 17a of the auxiliary device is connected to the source pad 17 of the semiconductor element.

An $SiO_2$ film, an $Si_3N_4$ film, an SiON film, or the like can be used for the device isolation insulating film 10a. Moreover, a low dielectric constant insulating film such as a porous silica film, an SiOF film, an SOG film, or an SiOC film can be used for the device isolation insulating film 10a. Other materials described for the control electrode isolation insulating film 10 above may also be used. Furthermore, a cavity may be included in the device isolation insulating film 10a. It is preferable that the thickness of the device isolation insulating film 10a be greater than that of the gate insulating film 12 and approximately equal to the depth of the gate trenches 9; in other words, a thickness of approximately 100 nm to 2 µm is preferable.

Similar to in the semiconductor element, in the center portion of the peripheral circuit region 42 which is separated from the isolation trench region 20, the base contact region 7, the base region 4, the upper embedded regions 6a, the lower embedded regions 5a, and the current transport layer (2, 3) form a body diode. Moreover, the base contact region 7, the base region 4, the upper embedded region 6d, the lower embedded region 5d, and the current transport layer (2, 3) near the periphery of the isolation trench 20 form a parasitic diode. The auxiliary device isolation insulating film 10a is formed going through the base contact region 7, the base region 4, and the upper embedded region 6d, and the corners of the bottom surface of the auxiliary device isolation insulating film 10a are covered by the lower embedded region 5d. Thus, there is no p-type semiconductor layer beneath the device isolation insulating film 10a, while the side faces and the bottom surface corners contact p-type semiconductor layers. Moreover, it is possible to make the cross-sectional area of the upper embedded region 6d and the lower embedded region 5d small.

Figure 15:
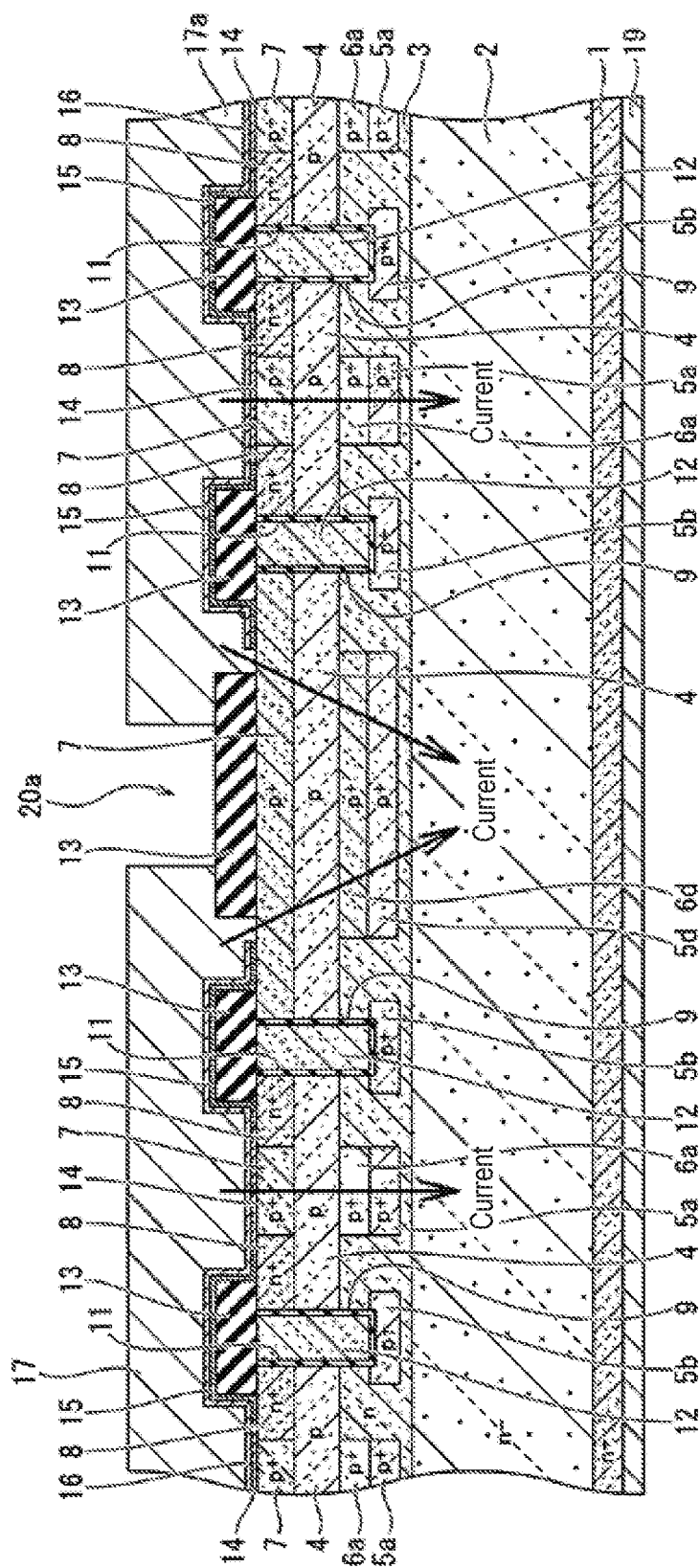
FIG. 15 is a cross-sectional view of the primary components of a semiconductor device according to a comparison example.

FIG. 15 illustrates device isolation in a conventional MOSFET. As illustrated in FIG. 15, here, a semiconductor element and an auxiliary device are isolated from one another by an interlayer insulating film 13 arranged on a base contact region 7 in an isolation trench region 20a. A lower embedded region 5d and an upper embedded region 6d below the isolation trench region 20a enhance the device isolation effect and are therefore formed to be approximately as wide as or wider than the isolation trench region 20a. Thus, the cross-sectional area of the base contact region 7, the base region 4, the upper embedded region 6d, and the lower embedded region 5d in the isolation trench region 20a is approximately the same as the cross-sectional area of the device isolation insulating film 10a. In this conventional MOSFET, the cross-sectional area of a parasitic diode formed by the base contact region 7 to the lower embedded region 5d is greater than the cross-sectional area of a body diode formed by the base contact region 7 to a lower embedded region 5a. As a result, during commutation, a large forward current flows through the parasitic diode, thereby causing the MOSFET to generate a large amount of heat and also causing conduction degradation to occur.

In the MOSFET according to Embodiment 2 of the present invention, device isolation is achieved by forming the auxiliary device isolation insulating film 10a in the isolation trench region 20. This makes it possible to reduce the cross-sectional areas of the p-type upper embedded region 6d and lower embedded region 5d which are arranged below the isolation trench region 20. This, in turn, makes it possible to reduce the cross-sectional area of the parasitic diode formed by the base contact region 7 to the lower embedded region 5d, to reduce the magnitude of the forward current that flows through the parasitic diode during commutation, and to inhibit conduction degradation in the MOSFET.

Figure 16:
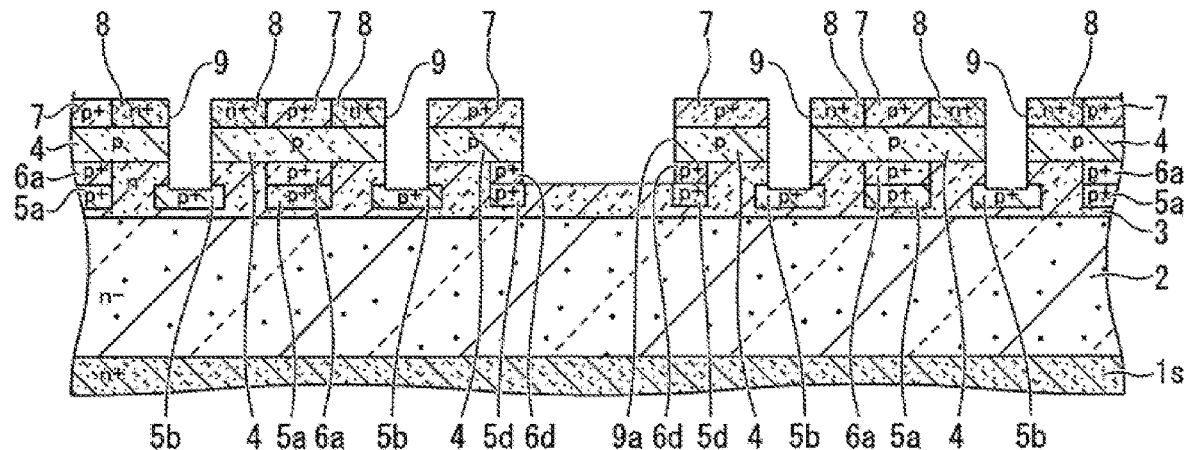
FIG. 16 is a cross-sectional view for explaining a step in an example of a method of manufacturing the semiconductor device according to Embodiment 2 of the present invention.
Figure 17:
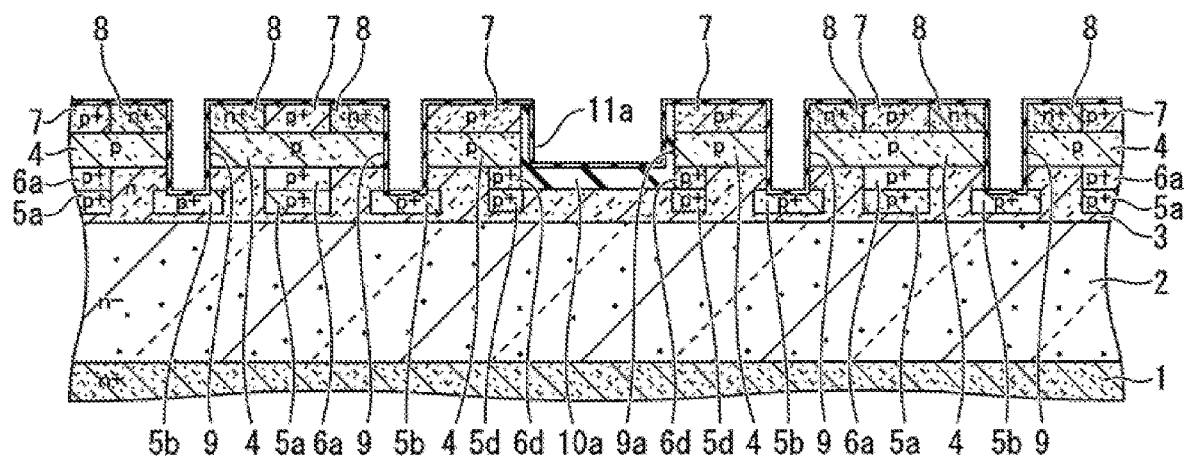
FIG. 17 is a cross-sectional view for explaining the step after FIG. 16 in the example of the method of manufacturing the semiconductor device according to Embodiment 2 of the present invention.
Figure 18:
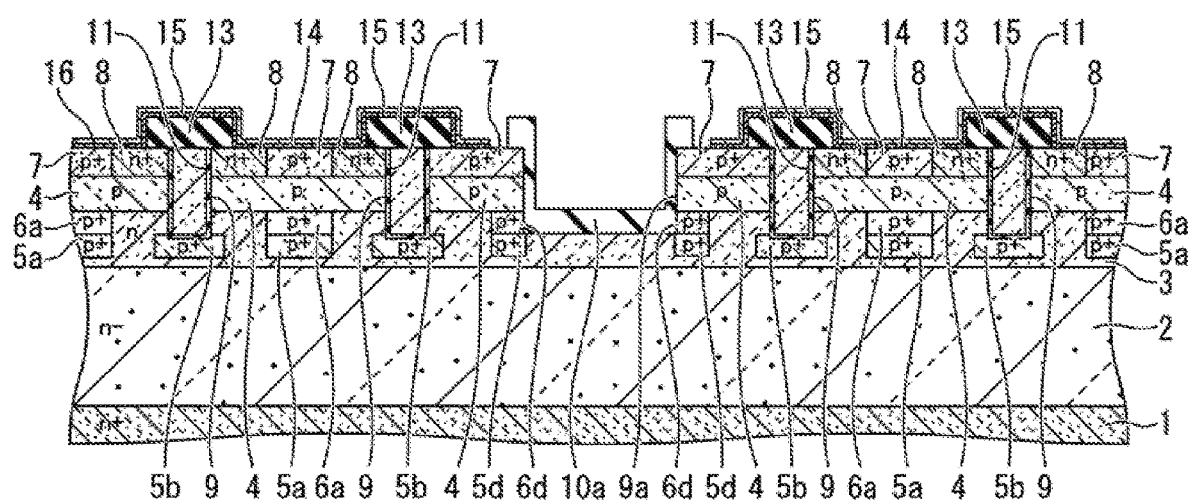
FIG. 18 is a cross-sectional view for explaining the step after FIG. 17 in the example of the method of manufacturing the semiconductor device according to Embodiment 2 of the present invention.

Next, a method of manufacturing the insulated-gate semiconductor device according to Embodiment 2 of the present invention will be described with reference to FIGS. 16 to 18. In Embodiment 2, the steps from the step of forming the trenches to a step of forming the auxiliary device isolation insulating film 10a are different from in Embodiment 1. The rest of the steps are the same as in the method of manufacturing the semiconductor device according to Embodiment 1 of the present invention and therefore will not be described again here.

After forming the lower embedded regions 5a, 5b, and 5d; the upper embedded regions 6a and 6d; the source region 8; and the base contact region 7, the gate trenches 9 and the auxiliary device isolation trench 9a are selectively formed using a photolithography technology and a dry etching process such as RIE, or the like. As illustrated in FIG. 16, the gate trenches 9 go through the source region 8 and the base region 4 and reach the embedded layers 5b in the current spreading layer 3. The auxiliary device isolation trench 9a goes through the base contact region 7, the base region 4, and the upper embedded region 6d and reaches the ring-shaped embedded layer 5d. As a result, the side surfaces of the auxiliary device isolation trench 9a are covered by the base contact region 7, the base region 4, and the upper embedded region 6d, and the bottom surface corners are covered by the lower embedded region 5d. Moreover, the lower embedded region 5d and the upper embedded region 6d are formed in a ring shape surrounding the periphery of the auxiliary device isolation trench 9a.

Next, using a CVD process or the like, an insulating film is deposited filling in the auxiliary device isolation trench 9a. Then, using an etch-back process utilizing a dry etching technology or the like, for example, the auxiliary device isolation insulating film 10a is formed within the auxiliary device isolation trench 9a. Next, as illustrated in FIG. 17, using a low-pressure CVD process or the like, an insulating film 11a such as an HTO film is deposited on the bottom surfaces and side surfaces of the gate trenches 9 as well as on the top surfaces of the source region 8, the base contact region 7, the base region 4, and the auxiliary device isolation insulating film 10a.

Then, using a CVD process or the like, a doped polysilicon layer doped with phosphorus (P) or the like is deposited filling in the gate trenches 9. Next, using a photolithography technology and a dry etching process or the like, portions of the polysilicon layer and the insulating film 11a are selectively removed. As a result, gate electrode structures constituted by the gate insulating film 11 deposited on the side surfaces and bottom surfaces of the gate trenches 9 as well as the gate electrodes 12 made of the polysilicon layer are formed. Meanwhile, although the insulating film 11a (which becomes part of the auxiliary device isolation insulating film 10a) is formed on the top surface of the auxiliary device isolation insulating film 10a, no polysilicon layer is formed in this region.

Next, using a CVD process or the like, an insulating film is deposited on the top surfaces of the gate electrode structures constituted by the gate electrodes 12 and the gate insulating film 11 as well as on the top surface of the auxiliary device isolation insulating film 10a. Then, using a photolithography technology and a dry etching process, the deposited insulating film is selectively removed. As a result, source contact holes and a gate contact hole are formed in the interlayer insulating film 13. Next, as illustrated in FIG. 18, using a sputtering process or a vapor deposition process followed by photolithography and RIE or the like, the source contact layer 14, the lower barrier metal layer 15, and the upper barrier metal 16 are formed. Then, a metal film made of Al or the like is patterned to form the source pads 17 and 17a. Next, the drain electrode 19 made of Au or the like is formed on the drain region 1. This completes the insulated-gate semiconductor device according to Embodiment 2 as illustrated in FIG. 14.

In the method of manufacturing the insulated-gate semiconductor device according to Embodiment 2 of the present invention, the side faces of the auxiliary device isolation insulating film 10a in the isolation trench region 20 are covered by the base contact region 7, the base region 4, and the upper embedded region 6d, and the corners of the bottom surface of the auxiliary device isolation insulating film 10a are covered by the lower embedded region 5d. This configuration facilitates reducing the cross-sectional area of the upper embedded region 6d and the lower embedded region 5d, thereby making it possible to substantially reduce the cross-sectional area of the parasitic diode. This, in turn, prevents conduction degradation caused by the parasitic diode and also makes it possible to provide an insulated-gate semiconductor device that makes it possible to reduce the strength of the electric field near the bottom surface of the auxiliary device isolation insulating film 10a.

Other Embodiments

Although the present invention was described above with reference to Embodiments 1 and 2, the descriptions and drawings of this disclosure should not be understood to limit the present invention in any way. Various alternative embodiments, examples, and applied technologies will be apparent to a person skilled in the art based on this disclosure. For example, Embodiment 2 may be modified such that the lower portion 5d of the current suppression layer covers the entire bottom surface of the auxiliary device isolation insulating film 10a like in Embodiment 1. The present invention includes various other embodiments and the like that are not explicitly described here, such as configurations achieved by freely applying aspects of the embodiments and modification example described above. Accordingly, the technical scope of the present invention is defined only by the characterizing features of the invention as set forth in the claims, which are appropriately derived from the descriptions above.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A silicon carbide semiconductor device, comprising:
   a current transport layer made of silicon carbide semiconductor of a first conductivity type;
   a base region made of silicon carbide semiconductor of a second conductivity type formed on the current transport layer;
   an insulated-gate electrode structure that is formed inside a gate trench having a gate insulating film formed on an entire bottom surface and entire side surfaces of the gate trench, the gate trench going through the base region and reaching an upper portion of the current transport layer to control a primary current flowing through the base region;
   a current suppression layer of the second conductivity type embedded within another upper portion of the current transport layer directly under the base region at a position different from a position at which the insulating-gate electrode structure is formed, at least a portion of the current suppression layer being located directly under the base region;
   a control electrode isolation insulating film filled into a control electrode isolation trench that goes through the base region and reaches an upper portion of the current suppression layer, the control electrode isolation insulating film being thicker than any portion of the gate insulating film, the control electrode isolation trench being wider than the gate trench and having a substantially flat bottom; and
   a control electrode pad disposed on the control electrode isolation insulating film and electrically connected to the insulated-gate electrode structure, the control electrode pad being made of Al, AlSi, AlCu, or AlCuSi, and disposed above the control electrode isolation trench filled with the control electrode isolation insulating film, the control electrode pad being exposed to an exterior and vertically aligned with the control electrode isolation insulating film so as to function as a pad above the control electrode isolation insulating film,
   wherein the upper portion of the current suppression layer abuts a sidewall of the control electrode isolation insulating film, and a lower portion of the current suppression layer covers at least bottom corners of the control electrode isolation insulating film in the control electrode isolation trench.

2. The silicon carbide semiconductor device according to claim 1, wherein the gate trench and the control electrode isolation trench are of equal depth.

3. The silicon carbide semiconductor device according to claim 1, wherein the lower portion of the current suppression layer covers an entire bottom surface as well as the bottom corners of the control electrode isolation insulating film.

4. The silicon carbide semiconductor device according to claim 1, wherein a thickness of the control electrode isolation insulating film is approximately equal to a depth of the gate trench.

5. The silicon carbide semiconductor device according to claim 1,
   wherein a thickness of the gate insulating film is approximately 10 nm to 150 nm, and
   wherein a thickness of the control electrode isolation insulating film is approximately 100 nm to 2 μm.

* * * * *